(12) United States Patent
Jin et al.

(10) Patent No.: US 12,176,446 B2
(45) Date of Patent: *Dec. 24, 2024

(54) SOLAR CELL, PHOTOVOLTAIC MODULE, AND METHOD FOR PREPARING THE SOLAR CELL

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Bike Zhang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/493,596

(22) Filed: Oct. 24, 2023

(65) Prior Publication Data
US 2024/0055541 A1 Feb. 15, 2024

Related U.S. Application Data

(63) Continuation of application No. 18/169,865, filed on Feb. 15, 2023, now Pat. No. 11,862,741, which is a (Continued)

(30) Foreign Application Priority Data

Apr. 11, 2022 (CN) .......................... 202210377277.0

(51) Int. Cl.
H01L 31/0236 (2006.01)
H01L 31/0216 (2014.01)
(Continued)

(52) U.S. Cl.
CPC .. *H01L 31/02363* (2013.01); *H01L 31/02167* (2013.01); *H01L 31/022425* (2013.01); *H01L 31/022441* (2013.01); *H01L 31/0288* (2013.01)

(58) Field of Classification Search
CPC ....... H01L 31/02363; H01L 31/022425; H01L 31/0288; H01L 31/022441; H01L 31/02167
See application file for complete search history.

(56) References Cited

U.S. PATENT DOCUMENTS 6,114,046 A 9/2000 Hanoka
6,300,558 B1 10/2001 Takamoto et al.
(Continued)

FOREIGN PATENT DOCUMENTS

CN 108987505 A 12/2018
CN 109285897 A 1/2019
(Continued)

OTHER PUBLICATIONS

Zhejiang Jinko Solar Co., Ltd., et al., Notice of Allowance, U.S. Appl. No. 17/845,993, Jan. 26, 2023, 9 pgs.
(Continued)

*Primary Examiner* — Earl N Taylor
(74) *Attorney, Agent, or Firm* — USCH Law, PC

(57) ABSTRACT

The present disclosure provides a solar cell. The solar cell includes a substrate, where the substrate has a front surface and a rear surface, the rear surface includes a textured region and a flat region, a doped surface field is formed in the textured region of the substrate; a tunneling dielectric layer, where the tunneling dielectric layer is located on the flat region; a doped conductive layer, where the doped conductive layer is located on the tunnelling dielectric layer, the doped conductive layer has doping elements, and the doped (Continued)

conductive layer has the same type of the doping elements with the doped surface field; a rear electrode, where a part of a bottom portion of the rear electrode is located in the doped conductive layer and the part of the bottom portion of the rear electrode is in contact with the doped surface field.

20 Claims, 6 Drawing Sheets

Related U.S. Application Data continuation of application No. 17/845,993, filed on Jun. 21, 2022, now Pat. No. 11,621,359.

(51) Int. Cl.
*H01L 31/0224* (2006.01)
*H01L 31/0288* (2006.01)

(56) References Cited

U.S. PATENT DOCUMENTS

| | | | | |
|---|---|---|---|---|
| 11,621,359 | B1* | 4/2023 | Jin | H01L 31/035272 438/57 |
| 11,862,741 | B2* | 1/2024 | Jin | H01L 31/035272 |
| 2011/0290318 | A1 | 12/2011 | Engelhart et al. | |
| 2014/0096817 | A1* | 4/2014 | Xie | H01L 31/1804 438/85 |
| 2016/0126394 | A1 | 5/2016 | Romijn et al. | |
| 2017/0213921 | A1 | 7/2017 | Yang et al. | |
| 2022/0059718 | A1* | 2/2022 | Yuan | H01L 31/1868 |
| 2022/0102568 | A1* | 3/2022 | Yang | H01L 31/02167 |
| 2022/0271179 | A1* | 8/2022 | Li | H01L 31/02167 |

FOREIGN PATENT DOCUMENTS

| | | |
|---|---|---|
| CN | 208797020 U | 4/2019 |
| CN | 110098280 A | 8/2019 |
| CN | 110352501 A | 10/2019 |
| CN | 209471975 U | 10/2019 |
| CN | 110634971 A | 12/2019 |
| CN | 210805782 U | 6/2020 |
| CN | 111524983 A | 8/2020 |
| CN | 211182223 U | 8/2020 |
| CN | 112186067 A | 1/2021 |
| CN | 112331742 A | 2/2021 |
| CN | 112542521 A | 3/2021 |
| CN | 113078232 A | 7/2021 |
| CN | 214043687 U | 8/2021 |
| CN | 113488384 A | 10/2021 |
| CN | 113594304 A | 11/2021 |
| CN | 113921626 A | 1/2022 |
| CN | 113964212 A | 1/2022 |
| CN | 113964216 A | 1/2022 |
| CN | 113964212 B | 3/2022 |
| CN | 114242803 A | 3/2022 |
| EP | 2787541 A1 | 10/2014 |
| JP | 2009515336 A | 4/2009 |
| JP | 2011003877 A | 1/2011 |
| JP | 2011517119 A | 5/2011 |
| JP | 2011233875 A | 11/2011 |
| JP | 5019397 B2 | 9/2012 |
| JP | 2013524514 A | 6/2013 |
| JP | 2014204128 A | 10/2014 |
| JP | 2014239150 A | 12/2014 |
| JP | 2015056493 A | 3/2015 |
| JP | 2015207707 A | 11/2015 |
| JP | 2016501451 A | 1/2016 |
| JP | 5991945 B2 | 9/2016 |
| JP | 2017017323 A | 1/2017 |
| JP | 2017050402 A | 3/2017 |
| JP | 2017526164 A | 9/2017 |
| JP | 6975368 B1 | 12/2021 |
| KR | 20140143279 A | 12/2014 |
| WO | 2017145633 A1 | 8/2017 |
| WO | 2017163498 A1 | 9/2017 |
| WO | 2019021545 A1 | 1/2019 |

OTHER PUBLICATIONS

Zhejiang Jinko Solar Co., Ltd., et al., Extended European Search Report, EP 22179720.2, Dec. 20, 2022, 4 pgs.
Zhejiang Jinko Solar Co., Ltd., et al., JP First Office Action with English translation, JP 2022-108833, Jul. 28, 2022, 4 pgs.
Zhejiang Jinko Solar Co., Ltd., et al., JP First Office Action with English translation, JP2022-151996, Nov. 9, 2022, 7 pgs.
Zhejiang Jinko Solar Co., Ltd., et al., JP Decision to Grant a Patent with English translation, JP2022-151996, Mar. 2, 2023, 5pgs.
Zhejiang Jinko Solar Co., Ltd., et al., US Non-Final Rejection, U.S. Appl. No. 17/852,298, Jun. 8, 2023, 22 pgs.
Zhejiang Jinko Solar Co., Ltd., et al., Extended European Search Report, EP 22181370.2, Nov. 24, 2022, 8 pgs.
Zhejiang Jinko Solar Co., Ltd., et al., AU First Office Action, AU 2022204646, Jul. 6, 2023, 8 pgs.
Zhejiang Jinko Solar Co., Ltd., et al., JP First Office Action with English translation, JP 2022-097820, Aug. 5, 2022, 19 pgs.
Zhejiang Jinko Solar Co., Ltd., et al., JP Second Office Action with English translation, JP 2022-097820, Nov. 10, 2022, 14 pgs.
1 Zhejiang Jinko Solar Co., Ltd., et al., Advisory Action, U.S. Appl. No. 17/852,298, Jan. 12, 2024, 4 pgs.
Zhejiang Jinko Solar Co., Ltd., et al., Extended European Search Report, EP 24156165.3, May 28, 2024, 10 pgs.
Zhejiang Jinko Solar Co., Ltd., et al., Non-Final Rejection, U.S. Appl. No. 17/852,298, May 22, 2024, 26 pgs.
Zhejiang Jinko Solar Co., Ltd., et al., JP Notice of Reasons for Refusal with English translation, JP 2023-083541, Apr. 26, 2024, 14 pgs.

* cited by examiner

SOLAR CELL, PHOTOVOLTAIC MODULE, AND METHOD FOR PREPARING THE SOLAR CELL

CROSS REFERENCE TO RELATED APPLICATIONS

The present application is a continuation of U.S. patent application Ser. No. 18/169,865, filed on Feb. 15, 2023, which is a continuation of U.S. patent application Ser. No. 17/845,993, filed on Jun. 21, 2022, which claims priority to Chinese Patent Application No 202210377277.0, filed on Apr. 11, 2022, each of which is incorporated herein by reference in its entirety.

TECHNICAL FIELD

Embodiments of the present disclosure relate to the field of solar cells, in particular to a solar cell, a photovoltaic module, and a method for preparing the solar cell.

BACKGROUND

The factors that affect the performance (e.g., photoelectric conversion efficiency) of a solar cell include optical loss and electrical loss. The optical loss includes reflection loss on a front surface of the solar cell, shadow loss of contact grid lines, and non-absorption loss in long wavelength bands. The electrical loss includes loss caused by photogenerated carrier recombination on a surface and a body of a semiconductor, loss caused by contact resistance of the semiconductor and metal grid lines, and loss caused by contact resistance of metal and the semiconductor, etc.

In order to reduce the electrical loss and optical loss of the solar cell, it is generally necessary to perform a polishing process on a rear surface of the solar cell. The polishing process performed on the rear surface is mainly adopting a wet chemical method to polish a pyramid textured structure boron-doped on the rear surface, which increases the internal reflection of light, reduces the surface recombination rate of carriers, so as to improve the photoelectric conversion efficiency of the solar cell. In the polishing process performed on the rear surface, the shape and appearance of the rear surface of a crystalline silicon cell is conducive to the back reflection of long-wavelength light and the uniformity of film layer subsequently formed on the rear surface, which plays an important role in improving the efficiency of the solar cell. The polishing process performed on the rear surface can optimize the performance of the solar cell, but there are still many factors affecting the performance of this type of solar cell. It is of great significance to develop a passivated contact solar cell that is efficient.

SUMMARY

Embodiments of the present disclosure provide a solar cell, which is at least beneficial to reduce the contact resistance of the solar cell.

According to some embodiments of the present disclosure, an aspect of the embodiments of the present disclosure provides a solar cell, including: a substrate, where the substrate has a front surface and a rear surface that opposite to each other, the rear surface includes a textured region and a flat region adjacent to the textured region, a doped surface field is formed in the textured region of the substrate, there are doping elements in the doped surface field, and the doping elements are N-type doping elements or P-type doping elements; a tunneling dielectric layer, where the tunneling dielectric layer is located on the flat region of the rear surface of the substrate; a doped conductive layer, where the doped conductive layer is located a away from the rear surface of the substrate, the doped conductive layer has doping elements, and the doping elements in the doped conductive layer are of the same type as the doping elements in the doped surface field; a rear electrode, where a part of a bottom portion of the rear electrode is located in the doped conductive layer and the part of the bottom portion of the rear electrode is in contact with the doped surface field.

In some embodiments, for the same rear electrode, a ratio of an area of a contact surface between the doped surface field and the rear electrode and an area of a contact surface between the doped conductive layer and the rear electrode ranges from 1:2 to 2:1.

In some embodiments, for the same rear electrode, along a direction in which the at least one rear electrode is arranged, a ratio of a cross-sectional width of a contact surface between the doped surface field and the rear electrode and a width of the rear electrode ranges from 1:4 to 1:2.

In some embodiments, the cross-sectional width of the contact surface between the doped surface field and the rear electrode ranges from 5 µm to 20 µm.

In some embodiments, along a direction in which the at least one rear electrode is arranged, a ratio of a width of the textured region of the substrate and a width of the flat region of the substrate ranges from 1:3 to 1:1.

In some embodiments, the width of the textured region of the substrate ranges from 10 µm to 30 µm.

In some embodiments, along a direction in which the at least one rear electrode is arranged, a width of the textured region of the substrate is smaller than a width of the rear electrode.

In some embodiments, the rear surface includes a plurality of the textured regions arranged along an extending direction of the rear electrode, and a space between two adjacent textured regions in the plurality of the textured regions ranges from 10 mm to 20 mm.

In some embodiments, for the same rear electrode, multiple textured regions are formed on the rear surface along a direction in which the at least one rear electrode is arranged, and a space between two adjacent textured regions in the plurality of the textured regions ranges from 5 µm to 20 µm.

In some embodiments, along a direction from the rear surface to the front surface, the doped surface field includes a first doped region and a second doped region, a doping concentration of the first doped region is greater than a doping concentration of the second doped region, and the rear electrode is in contact with a surface of the first doped region.

In some embodiments, the doping concentration of the first doped region ranges from $2 \times 10^{20}$ cm$^{-3}$ to $2 \times 10^{21}$ cm$^{-3}$.

In some embodiments, a ratio of a depth of the first doped region and a height of the doped surface field ranges from 1.5% to 4%.

In some embodiments, the doped surface field includes at least one protruding structure, and a height difference between a top of the protruding structure and the rear surface of the substrate ranges from 2 µm to 10 µm.

In some embodiments, the number of the protruding structure is at least two, and a space between two adjacent protruding structures ranges from 2 µm to 4 µm.

In some embodiments, the protruding structure includes a pyramid-shaped structure.

According to some embodiments of the present disclosure, another aspect of the embodiments of the present disclosure further provides a photovoltaic module, including: at least one cell string, where the cell string is formed by connecting a plurality of solar cells with each other, each of the plurality of solar cells being a solar cell according to any one above; a package film configured to cover a surface of the cell string; a cover plate configured to cover a surface of the package film facing away from the cell string.

According to some embodiments of the present disclosure, yet another aspect of the embodiments of the present disclosure provides a method for preparing a solar cell, including: providing a substrate, where the substrate has a front surface and a rear surface that opposite to each other, the rear surface includes a textured region and a flat region adjacent to the textured region; forming a doped surface field, where the doped surface field is located in the textured region of the substrate, there are doping elements in the doped surface field, and the doping elements are N-type doping elements or P-type doping elements; forming a tunneling dielectric layer, where the tunneling dielectric layer is located on the flat region of the rear surface of the substrate; forming a doped conductive layer, where the doped conductive layer is located formed over the tunnelling dielectric layer away from the rear surface of the substrate, the doped conductive layer has doping elements, and the doping elements in the doped conductive layer are of the same type as the doping elements in the doped surface field; forming a rear electrode, where a part of a bottom portion of the rear electrode is located on the doped conductive layer and the part of the bottom portion of the rear electrode is in contact with the doped surface field.

In some embodiments, forming the doped surface field includes: providing an initial substrate, where the initial substrate has the front surface and the rear surface that opposite to each other, the rear surface includes the textured region and the flat region adjacent to the textured region; performing a texturing treatment formed over the initial substrate located at the textured region to form an initial textured structure; forming a tunneling dielectric film and a conductive film on the flat region formed over the initial substrate and on a surface of the initial textured structure; removing a part of the tunneling dielectric film and a part of the conductive film on the surface of the initial textured structure; performing a doping treatment on the initial textured structure and the conductive film to form the doped surface field, where remaining tunneling dielectric film is served as the tunneling dielectric layer, and remaining conductive film is served as the doped conductive layer.

In some embodiments, the texturing treatment is a laser process, and parameters of the laser process include: a laser wavelength ranges from 355 nm to 460 nm, a laser pulse width ranges from 20 ps to 80 ps, a laser power ranges from 30 W to 100 W.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating the technical solutions in the embodiments of the present disclosure or the prior art, the accompanying drawings required in the embodiments will be briefly introduced below. Obviously, these drawings in the following description are only a part of the embodiments of the present disclosure. For those of ordinary skill in the art, other drawings may also be obtained from these drawings without any creative effort.

DETAILED DESCRIPTION

Figure 1:
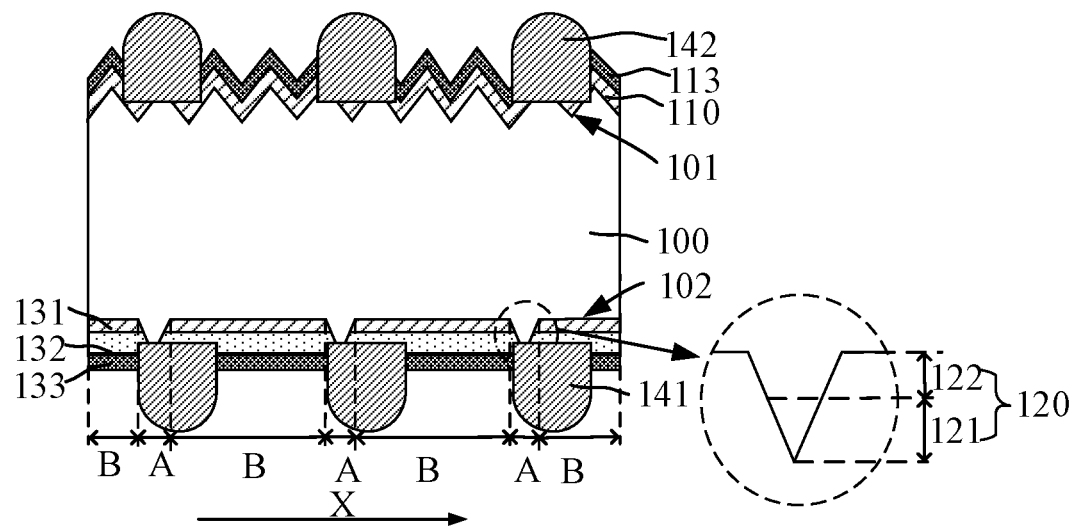
FIG. 1 is a schematic structural view of a solar cell provided according to an embodiment of the present disclosure.

As can be seen from the background technology, the prior art has a problem that the contact resistance of the solar cell is relatively large.

The analysis found that one of the factors for the large contact resistance of the solar cell is that, in the existing process, the textured structure formed over the solar cell is generally polished after the solar cell is textured, so as to improve the back reflection of long-wavelength light and the uniformity of film layer subsequently formed on the rear surface, which is beneficial to reduce the recombination rate of carrier on the rear surface and improve the utilization rate of light. However, after the rear surface is polished, it is difficult to match between the subsequently formed doped conductive layer and the rear metal electrode, that is, a good ohmic contact cannot be formed. Therefore, the contact resistivity of the doped conductive layer is relatively large, and the contact resistance between the rear electrode and the doped conducive layer is relatively large, which affects the efficiency improvement of the solar cell.

A solar cell is provided according to an embodiment of the present disclosure. The rear surface of the substrate of the solar cell includes the textured region and the flat region adjacent to the textured region, a doped surface field is formed on a surface of the textured region of the substrate, there are doping elements in the doped surface field, and a part of the bottom portion of the rear electrode is in contact with the doped surface field, that is, the rear electrode is in direct contact with the doped surface field, so that the doped conductive layer forms a good ohmic contact with the rear electrode, which is beneficial to reduce the contact resistivity formed over the solar cell and overall improve the efficiency of the solar cell. The doped surface field has doping elements, which can be used as carriers to improve the mobility of carriers and further reduce the contact resistivity of the rear surface of the solar cell. The substrate located at the flat region is a non-textured structure. A conventional tunneling dielectric layer and a doped conductive layer are formed in the flat region of the substrate. The rear electrode is in direct contact with the doped conductive layer, which has a good passivation effect while reducing the recombination rate of carriers on the rear surface and increasing the utilization rate of light, so that the photoelectric conversion efficiency of the solar cell is improved.

The embodiments of the present disclosure will be described in detail below with reference to the accompanying drawings. However, those of ordinary skill in the art can understand that, in each embodiment of the present disclosure, many technical details are provided for readers to better understand the present disclosure. However, the technical solutions claimed in the present disclosure can be realized even without these technical details and various changes and modifications based on the following embodiments.

FIG. 1 is a schematic structural view of a solar cell according to an embodiment of the present disclosure.

Referring to FIG. 1, an aspect of the embodiments of the present disclosure provides a solar cell, including: a substrate 100, where the substrate 100 has a front surface 101 and a rear surface 102 that opposite to each other, the rear surface 102 includes a textured region A and a flat region B adjacent to the textured region A, a doped surface field 120 is formed in the textured region A of the substrate 100, there are doping elements in the doped surface field 120, and the doping elements are N-type doping elements or P-type doping elements. The solar cell further includes a tunneling dielectric layer 131, where the tunneling dielectric layer 131 is located on the flat region B on the rear surface 102 of the substrate 100. The solar cell further includes a doped conductive layer 132, where the doped conductive layer 132 is located formed over the tunnelling dielectric layer 131 away from the rear surface 102 of the substrate 100, the doped conductive layer 132 has doping elements, and the doping elements in the doped conductive layer 132 are of the same type as the doping elements in the doped surface field 120. The solar cell further includes a rear electrode 141, where a part of a bottom portion of the rear electrode 141 is located on the doped conductive layer 132 and the part of the bottom portion of the rear electrode 141 is in contact with the doped surface field 120.

In some embodiments, the solar cell is a tunnel oxide passivated contact, TOPCon, cell, which may include a double-sided tunnel oxide passivation contact cell or a single-sided tunnel oxide passivation contact cell. Exemplarily, the solar cell is a single-sided tunnel oxide passivation contact cell, and the rear surface of the solar cell has a tunnelling oxide passivation layer.

The substrate 100 is a region that absorbs incident photons to generate photo-generated carriers. In some embodiments, the substrate 100 is a silicon substrate 100, which may include one or more of monocrystalline silicon, polycrystalline silicon, amorphous silicon, or microcrystalline silicon. In other embodiments, the substrate 100 may be made of silicon carbide, organic material, or multi-component compound. The multicomponent compound may include, but is not limited to, perovskite, gallium arsenide, cadmium telluride, copper indium selenide etc. Exemplarily, the substrate 100 in the present disclosure is a single crystal silicon substrate.

In some embodiments, the front surface 101 of the substrate 100 is a light-receiving surface to absorb incident light, and the rear surface 102 of the substrate 100 is a backlight surface. The substrate 100 has doping elements, the doping elements are N-type doping elements or P-type doping elements, and the N-type doping element may be group V element, such as phosphorus, P, element, bismuth, Bi, element, stibium, Sb, element, or arsenic, As, element. The P-type element may be a group III element, such as boron, B, element, aluminum, Al, element, gallium, Ga, element, or indium, In, element. For example, in a case that the substrate 100 is a P-type substrate, its internal doping element is P-type element. For another example, in a case that the substrate 100 is an N-type substrate, its internal doping element is N-type element.

In some embodiments, the type of doping element in doped surface field 120 is the same as the type of doping element in substrate 100. For example, in a case that the substrate 100 is a P-type substrate, the doping element in the doped surface field 120 is P-type element. For another example, in a case that the substrate 100 is an N-type substrate, the doping element in the doped surface field 120 is N-type element.

The textured region A is a region of the rear surface 102 of the substrate 100 that has a textured structure, and the flat region B is a region of the rear surface 102 of the substrate 100 that is processed by a rear surface polishing process. In some embodiments, along an arrangement direction X of the rear electrode 141, a ratio of a width of the textured region A of the substrate 100 and a width of the substrate 100 located at the flat region B ranges from 1:3 to 1:1. Specifically, the ratio may be 1:2.8, 1:2.3, 1:1.9, 1:1.3 or 1:1. Preferably, the ratio of the width of the textured region A of the substrate 100 and the width of the substrate 100 located at the flat region B is 1:2. In this way, the area of the flat region B can be ensured to be larger, and the film integrity of the tunneling dielectric layer 131 and the doped conductive layer 132 on the substrate 100 located at the flat region B is better, and the passivation effect of the solar cell and the anti-PDI effect are desirable. In addition, the recombination rate of carriers on the rear surface is reduced, the utilization rate of light is improved, and the photoelectric conversion efficiency of the solar cell is improved. Further, the width of the textured region A of the substrate 100 ranges from 10 μm to 30 μm, such as 10.3 μm, 13 μm, 15 μm, 23 μm or 29 μm.

In some embodiments, along the arrangement direction X of the rear electrode 141, the width of the textured region A of the substrate 100 is smaller than the width of the rear electrode 141. Excessive width of the textured region A of the substrate 100 may affect the integrity and uniformity of the film in the flat region B, reduce the internal reflection of light, so as to be unfavorable for improving the surface recombination rate of carriers and the photoelectric conversion efficiency of the solar cell. In addition, the interface passivation effect of the passivation contact structure constructed by the tunneling dielectric layer 131 and the doped conductive layer 132 is affected, resulting in a high Jo load current and a decrease in the surface recombination rate of carriers.

In some embodiments, an extension direction of the textured region A is the same as that of the rear electrode, and an extension length of the textured region A corresponds to an extension length of the rear electrode 141, so that the doped surface field 120 located at the textured region A can increase the lateral transmission of the solar cell, reduce the lateral transmission loss of the solar cell, thereby improving the photoelectric conversion efficiency of the solar cell. In other embodiments, the rear surface 102 includes multiple textured regions A arranged along the extending direction of the rear electrode 141. A space between two adjacent textured regions A ranges from 10 mm to 20 mm, which reduces the recombination rate of carriers, and the area for collecting the carriers is enhanced, and the passivation effect of the formed passivation contact structure is better, which is beneficial to improve the open circuit voltage, Voc, and the filling factor, FF. Specifically, the space between two adjacent textured regions A may be 10.3 mm, 13 mm, 15.1 mm, 17 mm, or 19 mm. For the same rear electrode 141, multiple textured regions A are formed on the rear surface 102 along the arrangement direction X of the rear electrode 141. A space between two adjacent textured regions A ranges from 5 μm to 20 μm. Specifically, the space between two adjacent textured regions A may be 5.3 μm, 7 μm, 13 μm, 15 μm or 18.3 μm.

In some embodiments, for the same rear electrode 141, a ratio of an area of a contact surface between the doped surface field 120 and the rear electrode 141 and an area of a contact surface between the doped conductive layer 132 and the rear electrode 141 ranges from 1:2 to 2:1, specifically the ratio may be 1.3:2, 1.6:2, 1:1.2, 2:1.8, or 2:1.3. Preferably, the ratio of the area of the contact surface between the doped surface field 120 and the rear electrode 141 and the area of the contact surface between the doped conductive layer 132 and the rear electrode 141 ranges from 1:1.2 to 1.2:1, specifically the ratio may be 1:1.15, 1:1.1, 1:1 or 1.13:1. In this way, the rear electrode 141 is ensured to be in contact with the doped surface field 120 or be regarded that the rear electrode 141 is in direct contact with the substrate 100, so that the rear electrode and the substrate form a good ohmic contact, which reduces the contact resistance of the rear electrode 141. Moreover, the integrity of film of the tunneling dielectric layer 131 and the doped conductive layer 132 on the substrate 100 located at the flat region B is desirable. The rear electrode 141 is in direct contact with the doped conductive layer 132, so that the passivation effect is desirable. In addition, the recombination rate of carriers on the rear surface is reduced, and the utilization of light is improved, so that the photoelectric conversion efficiency of the solar cell is improved.

In some embodiments, for the same rear electrode 141, along the arrangement direction X of the rear electrode 141, a ratio of a cross-sectional width of a contact surface between the doped surface field 120 and the rear electrode 141 and a width of the rear electrode 141 ranges from 1:4 to 1:2, specifically, the ratio may be 1:3.8, 1:3.3, 1:2.9, 1:2.3 or 1:2. Preferably, the ratio of the cross-sectional width of the contact surface between the doped surface field 120 and the rear electrode 141 and the width of the rear electrode 141 ranges from 1:2.5 to 1:3.2, specifically, the ratio may be 1:2.6, 1:2.9, 1:3 or 1:3.2. The rear electrode 141 has a width of 40 μm is taken as a reference, the cross-sectional width of the contact surface between the doped surface field 120 and the rear electrode 141 may range from 5 μm to 20 μm, specifically may be 6 μm, 8 μm, 12 μm, 15 μm or 19 μm.

In some embodiments, along a direction from the rear surface 102 to the front surface 101, the doped surface field 120 includes a first doped region 121 and a second doped region 122, and a doping concentration of the first doped region 121 is greater than that of the second doped region 122. The rear electrode 141 is in contact with a surface of the first doped region 121, and the doping concentration of the first doped region 121 is relatively larger, which is conducive to improve the transport efficiency of carriers, improve the open circuit and the current transmission efficiency, thereby being beneficial to improve the photoelectric conversion efficiency of the solar cell. The doping concentration of the first doped region 121 ranges from $2\times10^{20}$ $cm^{-3}$ to $2\times10^{21}$ $cm^{-3}$.

In some embodiments, the doping concentration of the first doped region 121 is greater than or equal to the doping concentration of the doped conductive layer 132. In this way, the recombination loss between the tunneling dielectric layer 131 and the doped surface field 120 and between the doped surface field 120 and the doped conductive layer 132 can be reduced, which is beneficial to improve the transport efficiency of carriers, improve the open circuit voltage and current transmission efficiency, thereby being beneficial to improve the photoelectric conversion efficiency of the solar cell. In addition, the doping concentration of the doped surface field 120 is greater than the doping concentration of the doped conductive layer 132, which can further reduce the contact resistance of the rear electrode 141, so as to improve the photoelectric conversion efficiency.

In some embodiments, a ratio of a depth of the first doped region 121 and a height of the doped surface field 120 ranges from 1.5% to 4%. Preferably, the depth of the first doped region ranges from 90 nm to 200 nm, specifically 130 nm, 160 nm, 178 nm or 193 nm. A doping depth of the first doped region 121 can avoid the tunneling effect caused by the high doping of the first doped region 121, that is, the doping elements of the first doped region 121 will not diffuse into the substrate 100, a surface in contact with an emitter 110, and the emitter 110, so that the open circuit voltage of the solar cell is increased, which is beneficial to improve the photoelectric conversion efficiency of the solar cell.

In some embodiments, the doped surface field 120 includes at least one protruding structure. A height difference between the top of the protruding structure and the rear surface 102 of the substrate 100 ranges from 2 μm to 10 μm. Due to the light trapping effect of the protruding structure and the height difference between the top of the protruding structure and the rear surface 102 of the substrate 100, the light is incident on a slope of a surface of protruding structure, and the light is then reflected to a slope of another protruding structure to form multiple absorptions. Under multiple reflections, the advancing direction of the incident light in the solar cell is changed, which not only prolongs the optical path, but also increases the absorption of long-wavelength photons.

In other embodiments, the number of protruding structures is at least two. A space between two adjacent protruding structures ranges from 2 μm to 4 μm, and the space between two adjacent protruding structures can ensure that the incident light is reflected by multiple times between two adjacent protruding structures to extend the optical path of incident light, thereby facilitating the absorption of long-wavelength photons.

In some embodiments, the protruding structure includes a pyramid-shaped structure, and the textured surface formed by the pyramid-shaped structure has a better antireflection effect, that is, the reflectivity of light is reduced, and the short-circuit current, Isc, is increased, thereby improving the photoelectric conversion efficiency of the solar cell. In other embodiments, the protruding structure includes pyramid-shaped structure or other pyramidal structures with a slope.

In some embodiments, the tunneling dielectric layer 131 may be made of, but is not limited to, aluminum oxide, silicon oxide, silicon nitride, silicon oxynitride, intrinsic amorphous silicon, intrinsic polysilicon, and other dielectric materials with tunneling function. The thickness of the tunneling dielectric layer 131 ranges from 0.5 nm to 2.5 nm. Optionally, the thickness of the tunneling dielectric layer 131 ranges from 0.5 nm to 2 nm. Further, the thickness of the tunneling dielectric layer 131 ranges from 0.5 nm to 1.2 nm. The doped conductive layer 132 may be made of at least one of polycrystalline semiconductor, amorphous semiconductor, or microcrystalline semiconductor. Preferably, the doped conductive layer 132 is made of at least one of polycrystalline silicon, amorphous silicon, or microcrystalline silicon. The thickness of the doped conductive layer 132 ranges from 40 nm to 150 nm. Optionally, the thickness of the doped conductive layer 132 ranges from 60 nm to 90 nm. The thickness of the doped conductive layer 132 can ensure that the optical loss of the doped conductive layer 132 is relatively small, and the interface passivation effect of the tunneling dielectric layer 131 is better, thereby improving the efficiency of the solar cell. Exemplarily, in the present disclosure, the doped conductive layer 132 is made of polysilicon, and the thickness of the doped conductive layer 132 is 80 nm.

In some embodiments, a passivation layer 133 is located on a surface of the doped conductive layer 132, and the passivation layer 133 can be regarded as a rear passivation layer. The passivation layer 133 may be a single-layer structure or a laminated structure, and the passivation layer 133 may be made of one or more of silicon oxide, silicon nitride, silicon oxynitride, silicon oxycarbonitride, titanium oxide, hafnium oxide, or aluminum oxide etc.

The rear electrode 141 is the grid line of the solar cell for collecting the current of the solar cell. The rear electrode 141 can be sintered from a fire-through type paste. The rear electrode 141 may be made of one or more of aluminum, silver, gold, nickel, molybdenum, or copper. In some embodiments, the rear electrode 141 refers to a thin grid line or a finger-shaped grid line to be distinguished from a main grid line or a bus bar.

In some embodiments, the solar cell further includes: a first passivation layer 113, the first passivation layer 113 is located on a surface of the emitter 110 away from the substrate 100, the first passivation layer 113 is regarded as a front passivation layer. Multiple electrodes 142 are arranged in a spaced manner, and the electrodes 142 penetrate the first passivation layer 113 to be in contact with the emitter 110.

In some embodiments, the first passivation layer 113 may be a single-layer structure or a laminated structure, and the first passivation layer 113 may be made of one or more of silicon oxide, silicon nitride, silicon oxynitride, silicon oxycarbonitride, titanium oxide, hafnium oxide or aluminum oxide.

Each of the multiple electrodes 142 may be sintered from a fire-through type paste. The contact between the electrodes 142 and the emitter 110 may be a localized contact or a complete contact. The electrodes 142 may be made of one or more of aluminum, silver, nickel, gold, molybdenum, or copper. In some embodiments, each of the electrodes 142 is an upper electrode or a front surface electrode. In some cases, each of the electrodes 142 refer to a thin grid line or a finger-like grid line to be distinguished from a main grid line or a bus bar.

In the solar cell provided according to an embodiment of the present disclosure, the rear surface of the substrate of the solar cell includes the textured region and the flat region adjacent to the textured region, a doped surface field is formed on a surface of the textured region of the substrate, there are doping elements in the doped surface field, and a part of the bottom portion of the rear electrode is in contact with the doped surface field, that is, the rear electrode is in direct contact with the doped surface field, so that the doped conductive layer forms a good ohmic contact with the rear electrode, which is beneficial to reduce the contact resistivity formed over the solar cell and overall improve the efficiency of the solar cell. The doped surface field has doping elements, which can be used as carriers to improve the mobility of carriers and further reduce the contact resistivity of the rear surface of the solar cell. The substrate located at the flat region is a non-textured structure. A conventional tunneling dielectric layer and a doped conductive layer are formed in the flat region of the substrate. The rear electrode is in direct contact with the doped conductive layer, which has a good passivation effect while reducing the recombination rate of carriers on the rear surface and increasing the utilization rate of light, so that the photoelectric conversion efficiency of the solar cell is improved.

Figure 2:
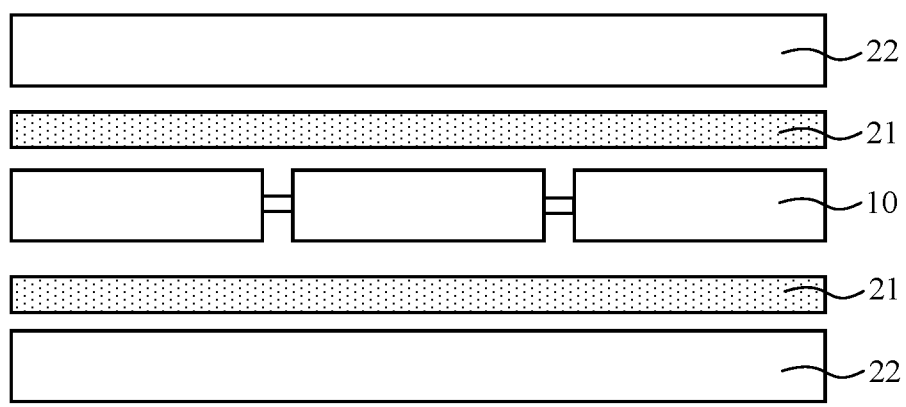
FIG. 2 is a schematic structural view of a photovoltaic module provided according to an embodiment of the present disclosure.

FIG. 2 is a schematic structural view of a photovoltaic module provided according to an embodiment of the present disclosure.

Correspondingly, referring to FIG. 2, another embodiment of the present disclosure further provides a photovoltaic module, which is configured to convert received light energy into electrical energy and transmit it to an external load. The photovoltaic module includes: at least one cell string, where the cell string is formed by connecting multiple solar cells 10 with each other, each of the multiple solar cells 10 being a solar cell 10 according to any one above (e.g., as described in FIG. 1); a package film 21 configured to cover a surface of the cell string; a cover plate 22 configured to cover a surface of the package film 21 facing away from the cell string.

The package film 21 may be embodied as an organic package film, such as ethyl vinyl acetate, EVA, or polyolefin elastomer, POE. The package film 21 is configured to cover a surface of the cell string to seal and protect the cell string. In some embodiments, the package film 21 includes an upper layer package film and a lower layer package film respectively covering both sides of the surface of the solar cell string. The cover plate 22 may be embodied as a cover plate such as a glass cover plate or a plastic cover plate for protecting the cell string, and the cover plate 22 is configured to cover the surface of the package film 21 away from the cell string. In some embodiments, a light trapping structure is arranged on the cover plate 22 to increase the utilization rate of incident light. The photovoltaic module has high current collection capability and low recombination rate of carriers, which can achieve high photoelectric conversion efficiency. In some embodiments, the cover plate 22 includes an upper cover plate and a lower cover plate located on both sides of the cell string.

Figure 3:
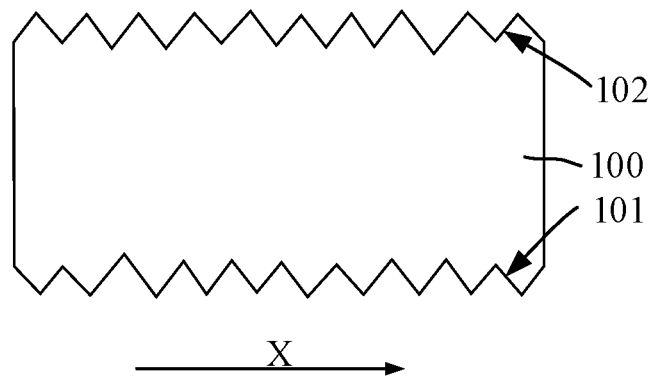
FIG. 3 is a schematic structural view of providing a substrate in a method for preparing a solar cell provided according to an embodiment of the present disclosure.
Figure 4:
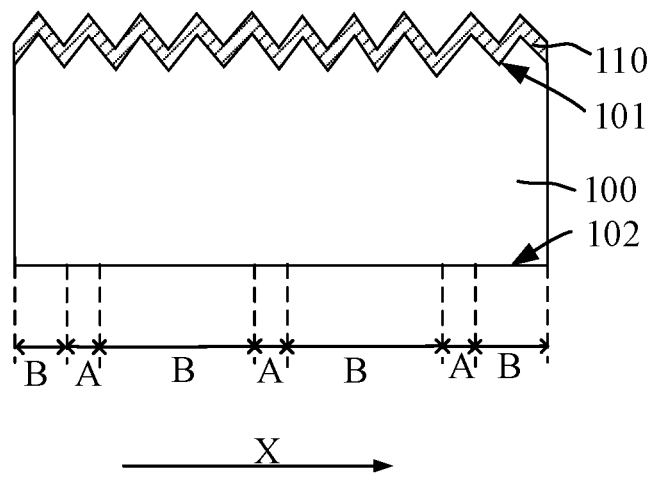
FIG. 4 is a schematic structural view of forming an emitter in a method for preparing a solar cell provided according to an embodiment of the present disclosure.
Figure 5:
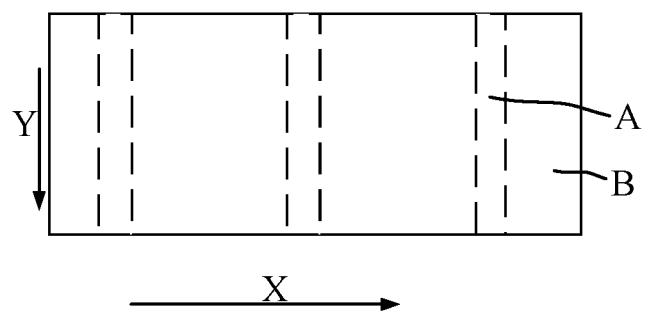
FIG. 5 is a schematic structural view of a rear surface of a substrate of a solar cell provided according to an embodiment of the present disclosure.
Figure 6:
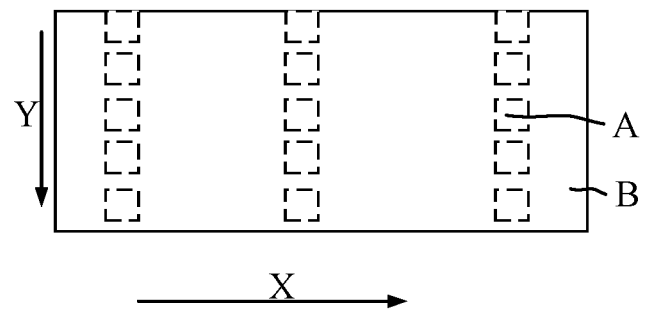
FIG. 6 is another schematic structural view of a rear surface of a substrate of a solar cell provided according to an embodiment of the present disclosure.
Figure 7:
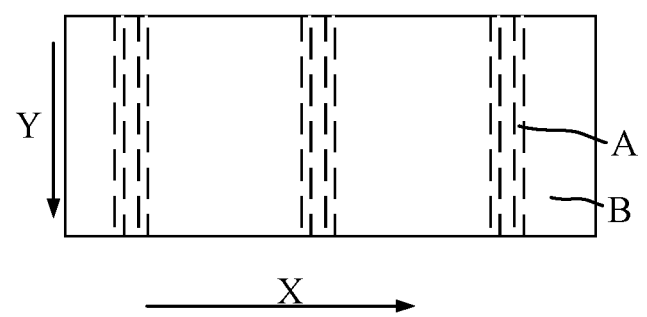
FIG. 7 is yet another structural schematic view of a rear surface of a substrate of a solar cell provided according to an embodiment of the present disclosure.
Figure 8:
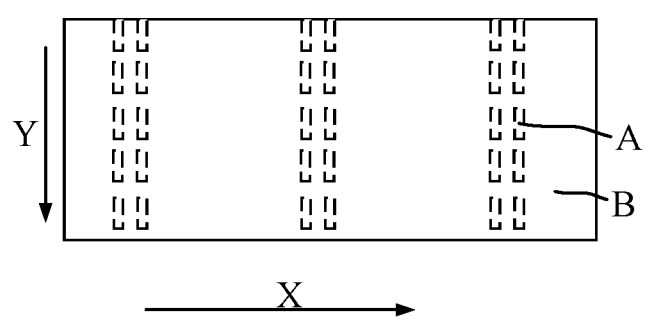
FIG. 8 is yet another schematic structural view of a rear surface of a substrate of a solar cell provided according to an embodiment of the present disclosure.
Figure 9:
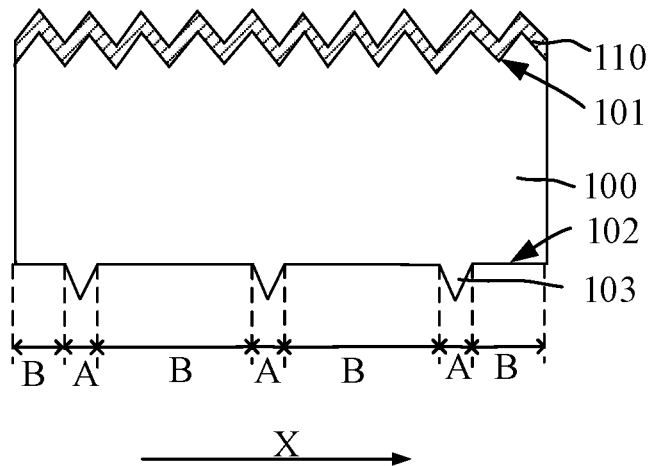
FIG. 9 is a schematic structural view of forming an initial textured structure in a method for preparing a solar cell provided according to an embodiment of the present disclosure.
Figure 10:
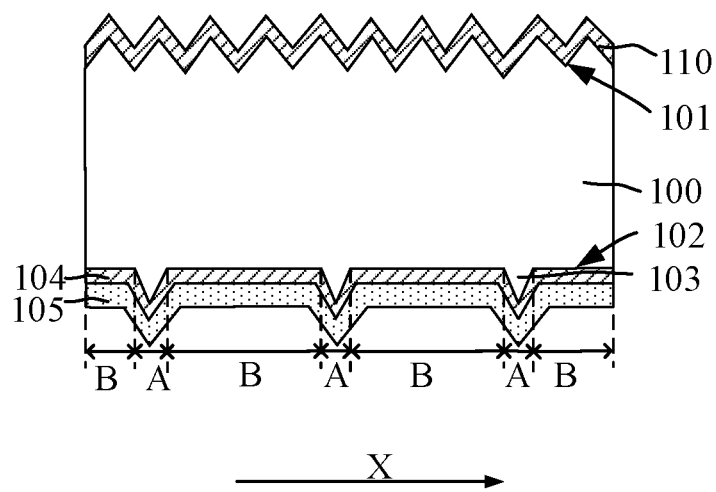
FIG. 10 is a schematic structural view of forming a conductive film in a method for preparing a solar cell provided according to an embodiment of the present disclosure.
Figure 11:
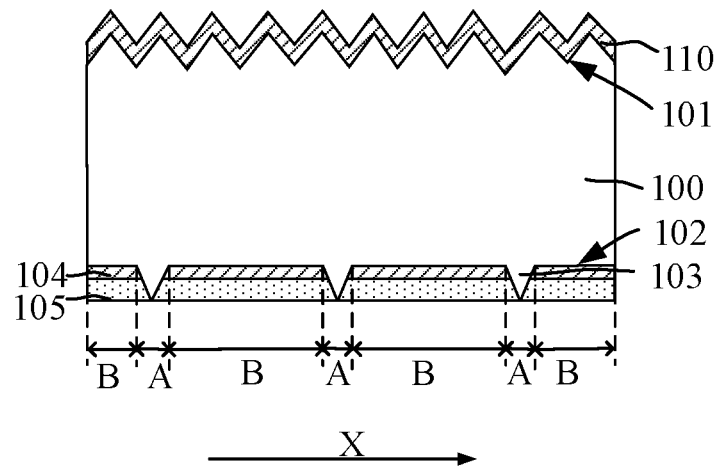
FIG. 11 is a schematic structural view of etching a conductive film in a method for preparing a solar cell provided according to an embodiment of the present disclosure.
Figure 12:
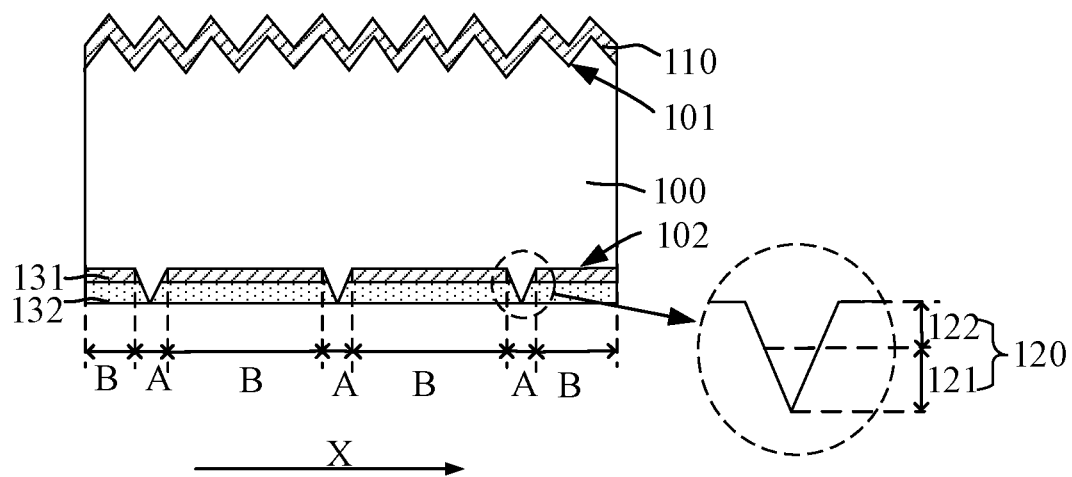
FIG. 12 is a schematic structural view of forming a doped surface field in a method for preparing a solar cell provided according to an embodiment of the present disclosure.
Figure 13:
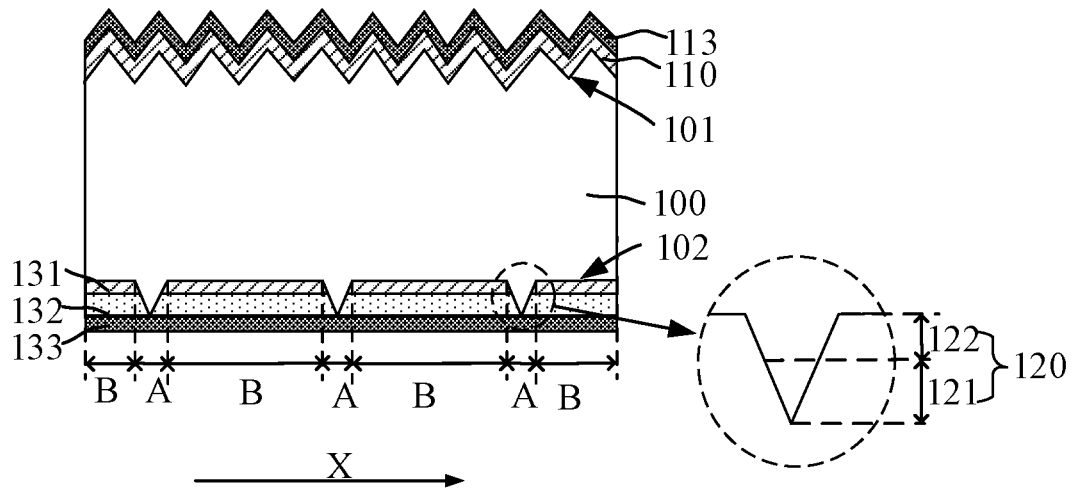
FIG. 13 is a schematic structural view of forming a passivation layer in a method for preparing a solar cell provided according to an embodiment of the present disclosure.
Figure 14:
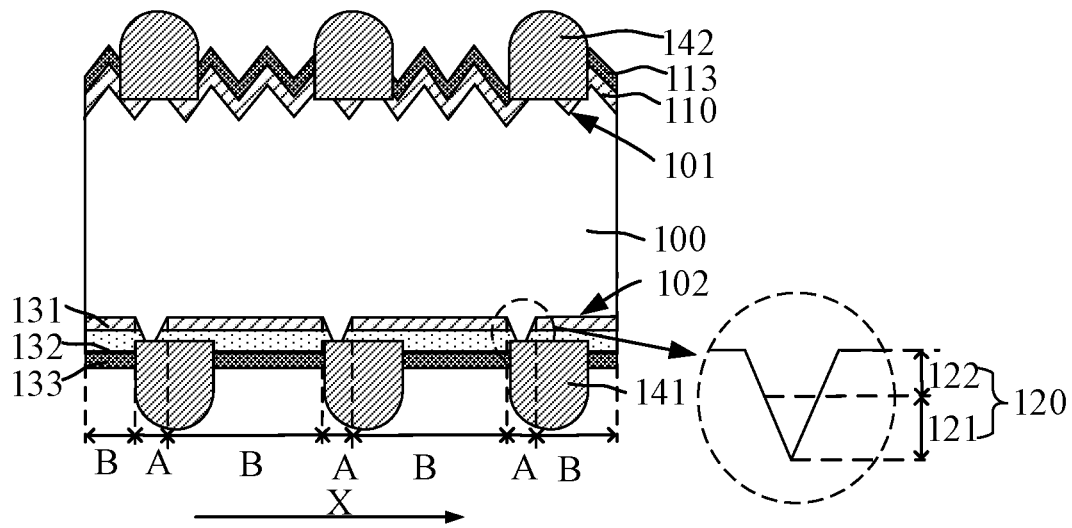
FIG. 14 is a schematic structural view of forming a rear electrode in a method for preparing a solar cell provided according to an embodiment of the present disclosure.

Correspondingly, another aspect of the embodiments of the present disclosure provides a method for preparing a solar cell, which is executed to prepare the solar cell provided in the above embodiment (FIG. 1). Details of the same or similar contents or elements as the descriptions given in the above embodiments will not be repeated, and only descriptions that are different from the above descriptions will be described in detail. FIG. 3 is a schematic structural view of providing a substrate in a method for preparing a solar cell provided according to an embodiment of the present disclosure; FIG. 4 is a schematic structural view of forming an emitter in a method for preparing a solar cell provided according to an embodiment of the present disclosure; FIG. 5 is a schematic structural view of a rear surface of a substrate of a solar cell provided according to an embodiment of the present disclosure; FIG. 6 is another schematic structural view of a rear surface of a substrate of a solar cell provided according to an embodiment of the present disclosure; FIG. 7 is yet another structural schematic view of a rear surface of a substrate of a solar cell provided according to an embodiment of the present disclosure; FIG. 8 is yet another schematic structural view of a rear surface of a substrate of a solar cell provided according to an embodiment of the present disclosure; FIG. 9 is a schematic structural view of forming an initial textured structure in a method for preparing a solar cell provided according to an embodiment of the present disclosure; FIG. 10 is a schematic structural view of forming a conductive film in a method for preparing a solar cell provided according to an embodiment of the present disclosure; FIG. 11 is a schematic structural view of etching a conductive film in a method for preparing a solar cell provided according to an embodiment of the present disclosure; FIG. 12 is a schematic structural view of forming a doped surface field in a method for preparing a solar cell provided according to an embodiment of the present disclosure; FIG. 13 is a schematic structural view of forming a passivation layer in a method for preparing a solar cell provided according to an embodiment of the present disclosure; and FIG. 14 is a schematic structural view of forming a rear electrode in a method for preparing a solar cell provided according to an embodiment of the present disclosure.

Referring to FIG. 3, a substrate 100 is provided. The substrate 100 has a front surface 101 and a rear surface 102 opposite to each other, and the front surface 101 and the rear surface 102 of the substrate 100 have a textured structure. In some embodiments, the textured structure can be prepared by a solution texturing method, and the textured structure can increase the number of refractions of light on the surface of the solar cell, which is beneficial to the absorption of light by the solar cell, so as to maximize the utilization rate of solar energy value of the solar cell. Specifically, the substrate 100 is made of monocrystalline silicon, and the surface of the substrate 100 is subjected to a texturing process by using a mixed solution of an alkaline solution and an alcohol solution. It will be appreciated that an initial substrate can be regarded as the substrate 100, and the initial substrate also has a front surface and a rear surface opposite to each other.

In some embodiments, the substrate 100 has doping elements, and the doping elements are N-type doping elements or P-type elements.

Referring to FIG. 4, the emitter 110 is formed on the front surface 101 of the substrate 100, and the rear surface 102 of the substrate 100 is polished to form a textured region A and a flat region B adjacent to the textured region A. In some embodiments, an alkaline solution or an acid solution can be used for polishing, and the rear surface 102 of the substrate 100 is a polished surface, which can increase the internal reflection of light, reduce the surface recombination rate of carriers, and improve the photoelectric conversion efficiency of the solar cell. The rear surface of the initial substrate includes a textured region and a flat region adjacent to the textured region.

In some embodiments, along an arrangement direction X of the rear electrode 141, a ratio of a width of the textured region A of the substrate 100 and a width of the substrate 100 located at the flat region B ranges from 1:3 to 1:1, specifically, the ratio may be 1:2.8, 1:2.3, 1:1.9, 1:1.3 or 1:1. Preferably, the ratio of the width of the textured region A of the substrate 100 and the width of the substrate 100 located at the flat region B is 1:2. Further, the width of the textured region A of the substrate 100 ranges from 10 μm to 30 μm.

Referring to FIG. 5, the extension direction of the texture region A is the same as the extension direction Y of the rear electrode 141 formed subsequently, and the extension length of the textured region A corresponds to an extension length of the rear electrode 141, so that the doped surface field 120 located at the textured region A can increase the lateral transmission of the solar cell, reduce the lateral transmission loss of the solar cell, thereby improving the photoelectric conversion efficiency of the solar cell. In other embodiments, the rear surface 102 includes multiple textured regions A arranged along the extending direction of the rear electrode 141. A space between two adjacent textured regions A ranges from 10 mm to 20 mm, which reduces the recombination rate of carriers, and the area for collecting the carriers is enhanced, and the passivation effect of the formed passivation contact structure is better, which is beneficial to improve the open circuit voltage, Voc, and the filling factor, FF. In yet other embodiments, in the same area where the rear electrode 141 is subsequently formed, the rear surface 102 includes multiple textured regions A arranged along the arrangement direction X of the rear electrode 141. A space between two adjacent textured regions A ranges from 5 μm to 20 μm. In yet other embodiments, in the same area where the rear electrode 141 is subsequently formed, the rear surface 102 includes multiple textured regions A arranged along the arrangement direction X of the rear electrode 141, and the multiple textured regions are arranged along the extension direction Y of the rear electrode 141.

Referring to FIG. 9 to FIG. 12, the doped surface field 120 is formed. The doped surface field 120 is formed on the textured region A of the substrate 100, and the doped surface field 120 has doping elements, and the doping elements are N-type doping elements or P-type doping elements. The tunneling dielectric layer 131 is formed, and the tunneling dielectric layer 131 is located on the flat region B of the rear surface 102 of the substrate 100. The doped conductive layer 132 is formed, and the doped conductive layer 132 is located on the surface of the tunneling dielectric layer 131 away from the rear surface 102 of the substrate 100, and the doped conductive layer 132 has doping elements, and the doping elements in the doped conductive layer 132 are of the same type as the doping elements in the doped surface field 130.

In some embodiments, along the direction from the rear surface 102 to the front surface 101, the doped surface field 120 includes the first doped region 121 and the second doped region 122, and the doping concentration of the first doped region 121 is greater than that of the second doped region 122. The doping concentration of the first doped region 121 is greater than or equal to the doping concentration of the doped conductive layer 132. Specifically, the doping concentration of the first doped region 121 ranges from $2\times10^{20}$ $cm^{-3}$ to $2\times10^{21}$ $cm^{-3}$.

In some embodiments, a ratio of the depth of the first doped region 121 and a height of the doped surface field 120 ranges from 1.5% to 4%. Preferably, the depth of the first doped region ranges from 90 nm to 200 nm, specifically 130 nm, 160 nm, 178 nm or 193 nm.

Specifically, referring to FIG. 9, the rear surface of the initial substrate located at the textured region A is subjected to a texturing process to form an initial textured structure 103. In some embodiments, the texturing process is a laser process, and parameters of the laser process include: laser wavelength ranges from 355 nm to 460 nm, laser pulse width ranges from 20 ps to 80 ps, laser power ranges from 30 W to 100 W, size of a laser spot ranges from 15 µm to 50 µm, laser frequency ranges from 200 kHz to 2 MHz, and laser line speed ranges from 20 m/s to 40 m/s. Preferably, the parameters of the laser process include: the laser wavelength ranges from 355 nm to 400 nm, the laser pulse width ranges from 20 ps to 50 ps, the laser power ranges from 50 W to 80 W, the size of the laser spot ranges from 10% to 30% of the size of the required laser area, the laser frequency ranges from 300 kHz to 800 kHz, and the laser line speed ranges from 20 m/s to 30 m/s.

In some embodiments, the initial textured structure 103 includes at least one protruding structure. The height difference between the top of the protruding structure and the rear surface 102 of the substrate 100 ranges from 2 µm to 10 µm, and the protruding structure includes a pyramid-shaped structure. In other embodiments, the number of protruding structures is at least two, the space between two adjacent protruding structures ranges from 2 µm to 4 µm, and the protruding structures include pyramid-shaped structures or other protruding structures with a slope.

Referring to FIG. 10, the tunneling dielectric film 104 and the conductive film 105 are formed on the flat region B located formed over the initial substrate and the surface of the initial textured structure 103.

Referring to FIG. 11, the tunneling dielectric film 104 and the conductive film 105 on the surface of the initial textured structure 130 are removed, so that the top surface of the conductive film 105 away from the substrate 100 is slightly lower than the highest end of the initial textured structure 103. Preferably, a height difference between the top surface of the conductive film 105 away from the substrate 100 and the highest end of the initial textured structure 130 ranges from 1 nm to 4 nm, so that the top surface of the initial textured structure 103 is exposed and the area the first doped region formed after the subsequent doping treatment is avoided to be smaller.

Referring to FIG. 12, the initial textured structure 103 (referring to FIG. 11) and the conductive film 105 (referring to FIG. 11) are doped to form the doped surface field 120, the remaining tunneling dielectric film 104 (referring to FIG. 11) serves as the tunneling dielectric layer 131, and the remaining conductive film 105 (referring to FIG. 11) serves as the doped conductive layer 132. In some embodiments, a borosilicate glass BSG layer is first formed on the initial textured structure 103 (referring to FIG. 11) and the conductive film 105 (referring to FIG. 11), and then a laser process is adopted for doping treatment, and finally the remaining BSG layer is removed. In other embodiments, the doping process is performed using an ion implantation process.

Referring to FIG. 13, the passivation layer 133 and the first passivation layer 113 are formed on the surface of the doped conductive layer 132, and the passivation layer 133 can be regarded as a rear passivation layer. The first passivation layer 113 is located at a surface of the emitter 110 away from the substrate 100, and the first passivation layer 113 is regarded as a front passivation layer.

Referring to FIG. 14, the rear electrode 141 is formed, and a part of the bottom portion of the rear electrode 141 is located in the doped conductive layer 131 and the part of the bottom portion of the rear electrode 141 is in contact with the doped surface field 120. The rear electrode 141 is in contact with the surface of the first doped region 121 of the doped surface field 120. In some embodiments, along the arrangement direction X of the rear electrode 141, the width of the textured region A of the substrate 100 is smaller than the width of the rear electrode 141.

In some embodiments, for the same rear electrode 141, the ratio of the area of the contact surface between the doped surface field 120 and the rear electrode 141 and the area of the contact surface between the doped conductive layer 132 and the rear electrode 141 ranges from 1:2 to 2:1, specifically the ratio may be 1.3:2, 1.6:2, 1:1.2, 2:1.8, or 2:1.3. Preferably, the ratio of the area of the contact surface between the doped surface field 120 and the rear electrode 141 and the area of the contact surface between the doped conductive layer 132 and the rear electrode 141 ranges from 1:1.2 to 1.2:1, specifically the ratio may be 1:1.15, 1:1.1, 1:1 or 1.13:1. For the same rear electrode 141, along the arrangement direction X of the rear electrode 141, the ratio of the cross-sectional width of the contact surface between the doped surface field 120 and the rear electrode 141 and the width of the rear electrode 141 ranges from 1:4 to 1:2, specifically, the ratio may be 1:3.8, 1:3.3, 1:2.9, 1:2.3 or 1:2. Preferably, the ratio of the cross-sectional width of the contact surface between the doped surface field 120 and the rear electrode 141 and the width of the rear electrode 141 ranges from 1:2.5 to 1:3.2, specifically, the ratio may be 1:2.6, 1:2.9, 1:3 or 1:3.2.

Reference is made back to FIG. 14, the electrodes 142 are formed, and the electrodes 142 penetrate the first passivation layer 113 to be in contact with the emitter 110.

Those of ordinary skill in the art can understand that the above embodiments are specific examples for implementing the present disclosure. In practice, various changes can be made in form and details without departing from the spirit and scope of the present disclosure. Any person skilled in the art can make changes and amendments without departing from the spirit and scope of the present disclosure. Therefore, the scope of protection of the present disclosure should be subject to the scope defined by the claims.

The invention claimed is:
1. A solar cell, comprising:
  a substrate having a front surface and a rear surface opposite to the front surface, wherein the rear surface has a textured region and a flat region adjacent to the textured region;
  a tunneling dielectric layer formed over the rear surface of the substrate;
  a doped conductive layer formed over the tunnelling dielectric layer;
  a rear passivation layer formed over the doped conductive layer; and
  at least one rear electrode having a bottom portion in the doped conductive layer, wherein part of the bottom portion is in contact with the textured region of the rear surface of substrate, and wherein a ratio of a width of the textured region and a width of the flat region along a direction in which the at least one rear electrode is arranged ranges from 1:3 to 1:1.

2. The solar cell according to claim 1, wherein a doped surface field is formed in the textured region of the substrate, and the doped surface field includes N-type doping elements or P-type doping elements.

3. The solar cell according to claim 2, wherein the doped surface field comprises at least one protruding structure, and a height of a top of the protruding structure with respect to the rear surface of the substrate ranges from 2 μm to 10 μm.

4. The solar cell according to claim 3, wherein a number of the at least one protruding structure is at least two, and a space between two adjacent protruding structures ranges from 2 μm to 4 μm.

5. The solar cell according to claim 4, wherein the at least one protruding structure comprises a pyramid-shaped structure.

6. The solar cell according to claim 2, wherein, a ratio of an area of a contact surface between the doped surface field and the rear electrode and an area of a contact surface between the doped conductive layer and the rear electrode ranges from 1:2 to 2:1.

7. The solar cell according to claim 6, wherein the ratio of the area of the contact surface between the doped surface field and the rear electrode and the area of the contact surface between the doped conductive layer and the rear electrode ranges from 1:1.2 to 1.2:1.

8. The solar cell according to claim 2, a thickness of the doped conductive layer ranges from 40 nm to 150 nm.

9. The solar cell according to claim 2, wherein along a direction in which the at least one rear electrode is arranged, a ratio of a cross-sectional width of a contact surface between the doped surface field and the rear electrode and a width of the rear electrode ranges from 1:4 to 1:2.

10. The solar cell according to claim 9, wherein the ratio of the cross-sectional width of the contact surface between the doped surface field and the rear electrode and the width of the rear electrode ranges from 1:2.5 to 1:3.2.

11. The solar cell according to claim 9, wherein the cross-sectional width of the contact surface between the doped surface field and the rear electrode ranges from 51 μm to 20 μm.

12. The solar cell according to claim 11, wherein an extension length of the plurality of textured region corresponds to an extension length of the rear electrode.

13. The solar cell according to claim 1, further comprising an emitter formed on the front surface of the substrate, a front passivation layer on a surface of the emitter away from the substrate, and a front surface electrode in contact with the emitter.

14. The solar cell according to claim 1, wherein the width of the substrate located at the textured region ranges from 10 μm to 30 μm.

15. The solar cell according to claim 1, wherein a plurality of textured regions are formed on the rear surface along a direction in which the at least one rear electrode is arranged, and a space between two adjacent textured regions in the plurality of the textured regions ranges from 5 μm to 20 μm.

16. The solar cell according to claim 1, wherein, along a direction from the rear surface to the front surface, the doped surface field comprises a first doped region and a second doped region, the depth of the first doped region ranges from 90 nm to 200 nm.

17. The solar cell according to claim 16, a thickness of the tunneling dielectric layer ranges from 0.5 nm to 2.5 nm.

18. The solar cell according to claim 13, wherein the front passivation layer and the rear passivation layer are single-layer structures or laminated structures, and the passivation layer and the rear passivation layer is made of one or more of silicon oxide, silicon nitride, silicon oxynitride, silicon oxycarbonitride, titanium oxide, hafnium oxide, or aluminum oxide.

19. The solar cell according to claim 18, wherein the front surface electrode penetrates the first passivation layer to be in contact with the emitter.

20. A photovoltaic module, comprising:
at least one cell string, wherein the cell string is formed by connecting a plurality of solar cells with each other;
a package film configured to cover a surface of the cell string; and
a cover plate configured to cover a surface of the package film facing away from the cell string;
wherein each of the plurality of solar cells comprises:
a substrate having a front surface and a rear surface opposite to the front surface, wherein the rear surface has a textured region and a flat region adjacent to the textured region, and wherein a ratio of a width of the textured region and a width of the flat region along a direction in which the at least one rear electrode is arranged ranges from 1:3 to 1:1;
a tunneling dielectric layer formed over the substrate;
a doped conductive layer formed over the tunnelling dielectric layer away from the substrate, the doped conductive layer including doping elements of the same type as doping elements in the substrate;
a rear passivation layer on a surface of the doped conductive layer; and
a rear electrode having a bottom portion in the doped conductive layer, wherein part of the bottom portion is in contact with the textured region of the rear surface of substrate.

* * * * *